United States Patent
Liao et al.

(10) Patent No.: US 10,462,920 B2
(45) Date of Patent: Oct. 29, 2019

(54) POLYMER FIBER COMPOSITE

(71) Applicant: HEWLETT-PACKARD DEVELOPMENT COMPANY, L.P., Houston, TX (US)

(72) Inventors: Cheng-Feng Liao, Taipei (TW); Kuan-Ting Wu, Taipei (TW); Yao-Win Fan, Taipei (TW); Hui He, Fort Collins, CO (US)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 15/518,521

(22) PCT Filed: Nov. 6, 2014

(86) PCT No.: PCT/US2014/064245
§ 371 (c)(1),
(2) Date: Apr. 12, 2017

(87) PCT Pub. No.: WO2016/072987
PCT Pub. Date: May 12, 2016

(65) Prior Publication Data
US 2017/0245385 A1    Aug. 24, 2017

(51) Int. Cl.
*B32B 5/02* (2006.01)
*B32B 5/26* (2006.01)
(Continued)

(52) U.S. Cl.
CPC ............. *H05K 7/02* (2013.01); *B29C 70/46* (2013.01); *B32B 5/022* (2013.01); *B32B 5/024* (2013.01);
(Continued)

(58) Field of Classification Search
CPC .... B32B 5/20; B32B 5/26; B32B 5/28; B32B 27/12; B32B 2260/046; B32B 2262/106; H05K 7/1427
See application file for complete search history.

(56) References Cited

U.S. PATENT DOCUMENTS 4,536,438 A    8/1985   Bishop et al.
4,778,717 A *  10/1988  Fitchmun ............. A43B 17/003
                                                        442/261
(Continued)

OTHER PUBLICATIONS

B.S. Hayes and L.M. Gammon, "Chapter 1: Introduction—Composite Materials and Optical Microscopy," Optical Microscopy of Fiber-Reinforced Composites, Feb. 15, 1998, pp. 1-22 ASM.

*Primary Examiner* — Joanna Pleszczynska
(74) *Attorney, Agent, or Firm* — HPI Patent Department (57) ABSTRACT

One example provides a composite. The composites includes a core layer comprising a thermoplastic polymer and having a first and a second sides opposite to each other; a first set of two layers disposed over at least a portion of the core layer respectively on the first and the second sides, each layer of the first set including carbon fibers aligned in a first direction in a plane; and a second set of two layers disposed over at least a portion of the first set of two layers respectively on the first and the second sides, each layer of the second set including carbon fibers aligned in a second direction perpendicular to the first direction in the plane In the plane, the composite has a length and a width, the length larger than the width and parallel to the second direction.

14 Claims, 5 Drawing Sheets

(51) Int. Cl.

| | | |
|---|---|---|
| *B32B 5/28* | (2006.01) | |
| *B32B 7/02* | (2019.01) | |
| *B32B 27/12* | (2006.01) | |
| *B32B 27/28* | (2006.01) | |
| *B32B 27/30* | (2006.01) | |
| *B32B 27/34* | (2006.01) | |
| *B32B 27/36* | (2006.01) | |
| *H05K 7/14* | (2006.01) | |
| *H05K 7/02* | (2006.01) | |
| *B32B 5/12* | (2006.01) | |
| *B32B 5/22* | (2006.01) | |
| *B32B 27/32* | (2006.01) | |
| *D06M 15/513* | (2006.01) | |
| *D06M 15/53* | (2006.01) | |
| *D06M 15/63* | (2006.01) | |
| *D06M 15/693* | (2006.01) | |
| *B29C 70/46* | (2006.01) | |
| *B32B 15/08* | (2006.01) | |
| *D06M 101/40* | (2006.01) | |
| *B29K 69/00* | (2006.01) | |
| *B29K 105/08* | (2006.01) | |
| *B29K 705/02* | (2006.01) | |
| *B29L 31/34* | (2006.01) | |

(52) U.S. Cl.
CPC ............. *B32B 5/12* (2013.01); *B32B 5/22* (2013.01); *B32B 5/26* (2013.01); *B32B 7/02* (2013.01); *B32B 15/08* (2013.01); *B32B 27/12* (2013.01); *B32B 27/285* (2013.01); *B32B 27/286* (2013.01); *B32B 27/288* (2013.01); *B32B 27/302* (2013.01); *B32B 27/308* (2013.01); *B32B 27/32* (2013.01); *B32B 27/34* (2013.01); *B32B 27/365* (2013.01); *D06M 15/513* (2013.01); *D06M 15/53* (2013.01); *D06M 15/63* (2013.01); *D06M 15/693* (2013.01); *B29K 2069/00* (2013.01); *B29K 2105/089* (2013.01); *B29K 2105/0881* (2013.01); *B29K 2705/02* (2013.01); *B29L 2031/3481* (2013.01); *B32B 2260/023* (2013.01); *B32B 2260/046* (2013.01); *B32B 2262/106* (2013.01); *B32B 2307/51* (2013.01); *B32B 2307/546* (2013.01); *B32B 2307/718* (2013.01); *B32B 2457/00* (2013.01); *B32B 2509/00* (2013.01); *D06M 2101/40* (2013.01)

(56) References Cited

U.S. PATENT DOCUMENTS

| | | | |
|---|---|---|---|
| 5,312,669 A * | 5/1994 | Bedard | A61F 2/5046 428/105 |
| 5,316,834 A | 5/1994 | Matsuda et al. | |
| 6,759,352 B2 | 7/2004 | Delanoy et al. | |
| 2003/0203693 A1 | 10/2003 | Delanoy et al. | |
| 2007/0269645 A1 | 11/2007 | Raghavendran et al. | |
| 2010/0055384 A1* | 3/2010 | Doecker | B32B 3/12 428/113 |
| 2010/0324208 A1 | 12/2010 | Motsanos et al. | |
| 2011/0210476 A1 | 9/2011 | Difonzo et al. | |
| 2012/0051007 A1* | 3/2012 | Alvarez | H05K 5/0213 361/752 |
| 2012/0160399 A1 | 6/2012 | Pratte et al. | |
| 2012/0295504 A1 | 11/2012 | Miyauchi et al. | |
| 2013/0119743 A1* | 5/2013 | Evans | B60N 2/68 297/452.18 |
| 2013/0164498 A1 | 6/2013 | Langone et al. | |
| 2014/0154456 A1 | 6/2014 | Liou et al. | |

\* cited by examiner

POLYMER FIBER COMPOSITE

BACKGROUND

The housing/casing of electronic devices, particularly those of portable electronic devices, is frequently subject to mechanical deformation due at least in part to its frequent contact with other objects (e.g., table, hand, ground, etc.). These devices, particularly the housing thereof, often need to have materials having high elasticity, at the same time being light weighed so as to be portable.

BRIEF DESCRIPTION OF THE DRAWINGS

The drawings are provided to illustrate various examples of the subject matter described herein related to a polymer-fiber composite and are not intended to limit the scope of the subject matter. The drawings are not necessarily to scale.

DETAILED DESCRIPTION

Following below are more detailed descriptions of various examples related to a polymer-fiber composite, particularly a composite comprising a thermoplastic core and a plurality of unidirectional carbon fibers disposed thereon. The various examples described herein may be implemented in any of numerous ways.

Provided in one aspect of the examples is a composite, comprising: a core layer comprising a thermoplastic polymer and having a first side and a second side opposite to the first side; a first set of two layers disposed over at least a portion of the core layer respectively on the first side and the second side, each layer of the first set comprising carbon fibers aligned in a first direction in a plane; and a second set of two layers disposed over at least a portion of the first set of two layers respectively on the first side and the second side, each layer of the second set comprising carbon fibers aligned in a second direction perpendicular to the first direction in the plane; wherein the composite in the plane has a length and a width, the length larger than the width and parallel to the second direction.

Provided in another aspect of the examples is an electronic device, comprising: an electrical circuit; a housing external to the electrical circuit, the housing comprising a composite comprising: a first set of two layers disposed over at least a portion of a core layer respectively on a first side and a second side, each layer of the first set comprising carbon fibers aligned in a first direction in a plane; and a second set of two layers disposed over at least a portion of the first set of two layers respectively on the first side and the second side, each layer of the second set comprising carbon fibers aligned in a second direction perpendicular to the first direction in the plane; wherein the composite in the plane has a length and a width, the length larger than the width and parallel to the second direction, and each layer in the first set has a larger thickness than each layer in the second set.

Provided in another aspect of the examples is a method of making, comprising: disposing a first set of two layers over at least a portion of a core layer respectively on a first side and a second side thereof, wherein the core layer comprises a thermoplastic, the first side is opposite to the second side, and each layer of the first set comprises carbon fibers aligned in a first direction in a plane; and disposing a second set of two layers over at least a portion of the first set of two layers respectively on the first side and the second side, each layer of the second set comprising carbon fibers aligned in a second direction perpendicular to the first direction in the plane, wherein the core layer and each layer of the first set and the second set each has a length and a width in the plane, the length larger than the width and parallel to the second direction; and thermal forming the layers of the first set and the second set and the core layer into a composite, the thermal forming involving compressing the layers of the first set and the second set and the core layer at a temperature higher than or equal to about 150° C.

Polymeric Core Layer

The core layer of the composite described herein may comprise any suitable material, depending on the application. The material may comprise, or be, a polymer. The polymer may be a thermoplastic. The weight-average molecular weight of the polymer employed in the particles may range from about 25,000 to about 350,000. Other molecular weight values are also possible, depending on the polymer involved and the application desired. The thermoplastic may comprise at least one of poly(methyl methacrylate) ("PMMA"), polycarbonate ("PC"), acrylonitrile butadiene styrene ("ABS"), poly (p-phenylene sulfide) ("PPS"), polyether ether ketone ("PEEK"), polyethersulfone ("PES"), and polyamide.

The polycarbonate herein may refer to any suitable polymer comprising at least one carbonate group. The PC may be commercially available PC polymers. For example, the PC may comprise any of Lexan® (by SABIC Innovative Plastics, Beijing, China), Valox® (by SABIC Innovative Plastics, Beijing, China), Makrolon® (by Bayer MaterialsScience LLC, MA, US), Makroclear® (by Arla Plast AB, Borensberg, Sweden), and arcoPlus® (from Gallina USA, WI, US). In one example, the PC comprises Valox® FRI® (from SABIC Innovative Plastics, Beijing, China). In another example, the PC comprises at least one of Lexan® FR60, FR63, FR5, FR700, FR25A, and FR83 (by SABIC Innovative Plastics, Beijing, China). In another example, the PC comprises at least one of Lexan® 8A13, 8A13E, 8A13F, 11A13, 8A35, 8A37, 8A73, 8B28, 8B35, 8B35E, 8B35F, and 8B38 (from SABIC Innovative Plastics, Beijing, China). In another example, the PC comprises at least one of Lexan® EFR63, BFR65, EFR85, EFR95, and EFR735 (from SABIC Innovative Plastics, Beijing, China). In one example, the PC comprises at least one of Makrolon® DE 1-1, DE 1-4, DE-6-2, DE 7-2, DE 248 1-1, and DE 318 2-4 (from Bayer MaterialsScience LLC, MA, US). Other polycarbonates are also possible.

In one example, the polymer comprises a polyamide having a weight-average molecular weight ranging from about 70,000 to about 300,000. The polyamide may comprise, or be, a nylon-nylon or PA 11 ("PA-11"), nylon or PA 12 ("PA-12"), nylon or PA 6 ("PA-6"), nylon or PA 8 ("PA-8"), nylon or PA 9 ("PA-9"), nylon or PA 66 ("PA-66"), nylon or PA 612 ("PA-612"), nylon or PA 812 ("PA-812"), nylon or PA 912 ("PA-912"), etc. The nylon may be a high molecular weight nylon—e.g., polyamide 12, polyamide 6, polyamide 8, polyamide 11, polyamide 86, and combinations thereof. Other polyamides are also possible.

Fiber-Containing Layer

The fibers in the different fiber-containing layers (of the different sets) in the composite described herein may comprise any suitable material, depending on the application. The fibers may comprise carbon fibers. The carbon fibers may be any type of fiber containing carbon atoms. The carbon fibers may comprise natural carbon fibers, synthetic carbon fibers, or both. For example, the carbon fibers may comprise at least one of polyacrylonitrile ("PAN"), rayon, pitch, and aramid carbon fibers. The carbon fibers may be commercially available carbon fibers. In one example, the carbon fibers comprise TORAYCA® T700S/T300 (from Toray Industries, Inc., Japan). In another example, the carbon fibers comprise Mitsubishi Rayon: PYROFIL® P330 series (from Mitsubishi Rayon Co., Ltd., Japan). In another example, the carbon fibers comprise at least one of Tenax®-J HTS40 E13 3K 200tex, HTS40 E13 6K 400tex, and HTS40 E13 12K 800tex (from Toho Tenax America, Inc., TN, US). In another example, the carbon fibers comprise at least one of Tenax®-E HTS40 F13 12K 800tex and HTS40 F13 24K 1600tex (from Toho Tenax America, Inc., TN, US).

The fibers may comprise continuous fibers. The fibers may have any suitable dimensions. In one example, the fibers have an average diameter of between about 5 μm and about 10 μm. Diameters of a larger or a smaller value are also possible. In one example, the fibers in a fiber-containing layer are continuous fibers and have the same length as the length of the fiber-containing layer and/or the composite. Shorter or longer fibers are also possible.

The fibers may be embedded within (e.g., pre-impregnated by) a polymeric matrix. The polymeric matrix may comprise any suitable polymer, such as a polymer resin. In one example, the polymeric matrix comprises a thermoplastic. The polymer in the polymeric matrix may be the same as or different from that of the polymeric core layer. The polymer in the polymeric matrix may comprise any of the aforementioned polymers suitable for the core layer. For example, the polymer in the polymeric matrix may comprise at least one of poly(methyl methacrylate) ("PMMA"), polycarbonate ("PC"), acrylonitrile butadiene styrene ("ABS"), poly (p-phenylene sulfide) ("PPS"), polyether ether ketone ("PEEK"), polyethersulfone ("PES"), and polyamide.

The fibers in a layer containing both fibers and a polymeric matrix may be present at any suitable content value. For example, the fibers may be between about 30 wt % and about 80 wt % (balanced by the matrix) in a fiber-containing layer—e.g., between about 35 wt % and about 75 wt %, between about 40 wt % and about 70 wt %, between about 45 wt % and about 65 wt %, between about 50 wt % and about 60 wt %, etc. Other content values are also possible.

The fibers in the fiber-containing fibers may be arranged in any orientation (or direction). The fibers may be any of the fibers described herein, including carbon fibers. For example, the fibers may be aligned in one preferred direction. As a result, the fiber-containing layer having the aligned fibers may exhibit anisotropic material properties. For example, the anisotropic fiber-containing layer may exhibit stronger mechanical properties (e.g. elastic modulus, flexural modulus, etc.) along the preferred aligned direction than the one orthogonal thereto in the same plane. A layer containing fibers aligned in one (preferred) direction may refer to a layer having at least about 80 vol % of the fibers aligned in that direction—e.g., at least about 85 vol %, about 90 vol %, about 95 vol %, about 99 vol %, about 99.5 vol %, about 99.9 vol %, or higher. Other vol % values are also possible. In one example, the fibers exhibiting a preferred direction herein are referred to as "unidirectional fibers."

The fibers may also be woven fibers. The fibers may be any of the fibers described herein, including carbon fibers. The woven fibers may comprise at least one of the following forms: plain, twill, satin, triaxial, stitched, basket, continuous strand mat, and veil. For example, the carbon fibers may be fed into a weaving machine to make woven fibers. In one example, a woven-fiber-containing layer exhibits isotropic material properties, at least with respect to the plane as defined by the layer. In other words, the isotropic fiber-containing layer may exhibit the same, or about the same, mechanical properties in all directions of the layer (in the plane).

Polymer-Fiber Composite

Figure 1A:
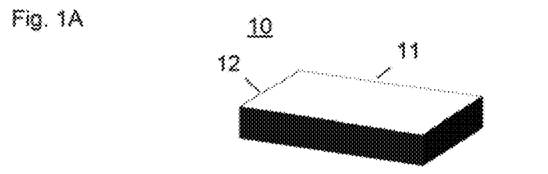
FIGS. 1A-1F show, in one example, different views and/or configurations of a polymer-fiber composite described herein.

The aforedescribed core layer and fiber-containing layer(s) may be assembled in any combination to form a polymer-fiber composite. FIGS. 1A-1F show different schematic views and/or configurations of a polymer-fiber composite 10 described herein in one example. FIG. 1A provides a schematic of an aerial view of one example of the composite, having a length 11 and width 12 in a plane (as defined by length 11 and width 12), with the length 11 being larger in dimension than the width 12. The terms "length" and "width" collectively are employed herein only to denote two different dimensions or a plane of the composite, with one dimension (i.e., length 11) being larger than the other (i.e., width 12).

FIGS. 1B-1F show schematics of the cross-sectional view of various configurations of the composite described herein in one example. The composite comprises a core layer 101; a first set of two layers 102 disposed over at least a portion of the core layer on the first side 1011 and the second side 1012; and a second set of two layers 103 disposed over at least a portion of the first sat of two layers 101 respectively on the first side and the second side. The core layer 101 may be any of the core layers described herein, comprising any of the materials described herein as suitable for the core layer.

Each of the fiber-containing layers of the polymer-fiber composite, including those of the first set 102 and those of the second set 103, may be any of the fiber-containing layers described herein, comprising any of the materials described herein as suitable for the fiber-containing layers. The fibers of the first set may be aligned in a first direction 13 (see FIG. 1B), and those of the second set may be aligned in a second direction 14, which is perpendicular to the first direction 13 in the plane as defined by 13 and 14 (see FIG. 1B). The plane as defined by the length 11 and width 12 (as shown in FIG. 1A) may be parallel to that as defined by directions 13 and 14. It is noted that parallel planes herein are considered the same plane. The direction 14 may be parallel to the length 11 (i.e., the larger dimension) of the composite.

The composite described herein may comprise at least one additional layer comprising fibers. For example, the composite may comprise a third set of two layers 104 disposed between the layers of the first set 102 and the second set 103 respectively on the first side 1011 and the second side 1012. See FIG. 1C. Each layer of the third set 104 may comprise fibers that are aligned in a specific direction. In one example, this specific direction is the first direction 13. It is noted that more than one additional (set) of layer(s) may be employed. It is also noted that the terms "first," "second," "third," etc. herein are merely used to connote that the objects they respectively describe are different entitles and are not meant to describe any chronological order, unless explicitly specified.

Each of the layers of the composite described herein may have any suitable thickness. In one example, these layers have the same thickness. In another example, these layers have different thickness. For example, the core layer may be thicker than the fiber-containing layers. The core layer may be thinner than the fiber-containing layers. In one example, all of the fiber-containing layers have the same thickness, and this thickness is different from that of the core layer. In another example, at least some of the fiber-containing layers have different thickness. In one example, the fiber-containing layers in each set of the two layers have the same thickness. In another example, the fiber-containing layers in each set of the two layers have different thickness.

In one example, the fiber-containing layers of the composite described herein have different thickness in different sets of the layers. For example, instead of having two layers of fibers both in the first direction, as shown in FIG. 1C, the composite may comprise a layer having fibers in the first direction that is thicker than a layer having fibers in the second direction. See FIG. 1D. For example, the layers of the first set 102 have a larger thickness than the layers of the second set 103. In one example, instead of having two layers of fibers both in the first direction, the composite comprises a first set of layers 102 that is each twice as thick as that of each layer in the second set 103.

The composite may further comprise a surface layer 105 disposed over at least one layer of the second set 103. The surface layer 105 is not needed in all of the instances but may be present in some instances. The surface layer may comprise woven fibers. FIG. 1E shows an example of one surface layer 105 disposed over one layer of the second of the composite as shown in FIG. 1E. FIG. 1F shows an example of one set of two surface layers 105 disposed over the second set of two layers respectively on the first side and the second side. Note that the surface layer may be employed in any of the composite configurations described herein, such as any of FIGS. 1B-1D. The woven fibers at the outermost layer may provide certain mechanical reinforcement and/or cosmetic functionalities, depending on the materials and configurations involved.

The overall polymer-fiber composite described herein may have any suitable thickness, depending on the application. For example, the composite may have a thickness in the millimeter range. In one example, the polymer-fiber composite described herein has a thickness of less than or equal to about 2.5 mm—e.g., less than or equal to about 2.0 mm, about 1.5 mm, about 1.2 mm, about 1.0 mm, about 0.8 mm, about 0.8 mm, or smaller. In another example, the thickness of the polymer-fiber composite is greater than or equal to about 2.5 mm. Within the composite, each layer may have any suitable thickness. In one example, the core layer has a thickness that is twice as much as each of the fiber-containing layers. In one example, the core layer has a thickness of about 0.2 mm, whereas each of the fiber-containing layers has a thickness of about 0.1 mm. Other thickness values for the core layer and the fiber-containing layers are also possible.

Any of the fiber-containing layers described herein may comprise fibers embedded within a polymeric matrix, as described above. The polymeric matrix may comprise any suitable material, such as those described herein. For example, the fibers in the first set may be embedded in a first thermoplastic polymeric matrix; and the fibers in the second set may be embedded in a second thermoplastic polymeric matrix. In one example, the different fiber-containing layers comprise different polymeric materials as the matrix material from one another—in the foregoing instance, the first thermoplastic polymeric matrix and the second thermoplastic polymeric matrix comprise different thermoplastic materials. In another example, the different fiber-containing layers comprise the same polymeric materials as the matrix material. In another example, some of the fiber-containing layers comprise the same polymeric materials as the matrix as some others, while the others comprise different polymeric materials.

Depending on the materials involved and the arrangement thereof, the polymer-fiber composite described herein may have any suitable mechanical properties. For example, the composite described herein may have a high flexural strength in comparison to a metal or a metal alloy of comparable, or the same, size. The flexural strength of a material herein may be reflected in the flexural modulus (also often known as "bending modulus") of the material. The flexural modulus of a material may be obtained by ASTM 0790 using a 3-point test on the material in the form of a rectangular beam and may be expressed by $$E_{flex}=L^3F/(4wh^3d);$$

where $E_{flex}$ is flexural modulus, w and h the width and thickness of the beam, L the distance between the two outer supports, and d the deflection due to the load F applied at the middle of the beam.

Figure 1B:
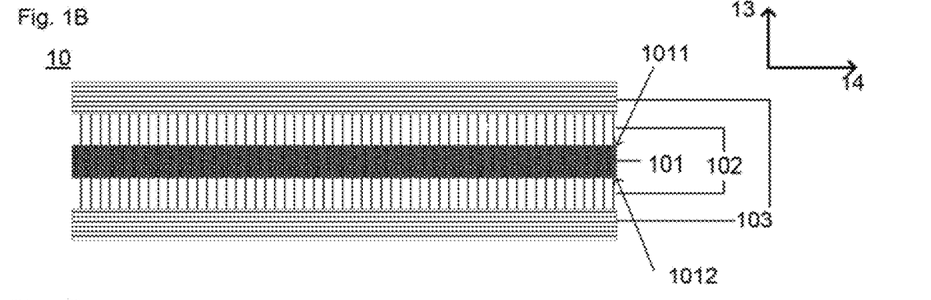
Figure 1C:
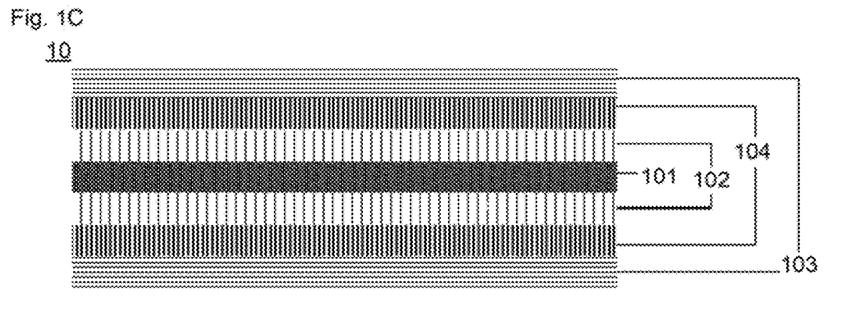
Figure 1D:
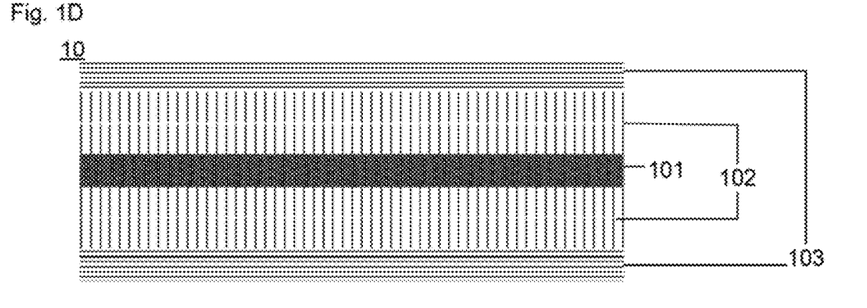
Figure 1E:
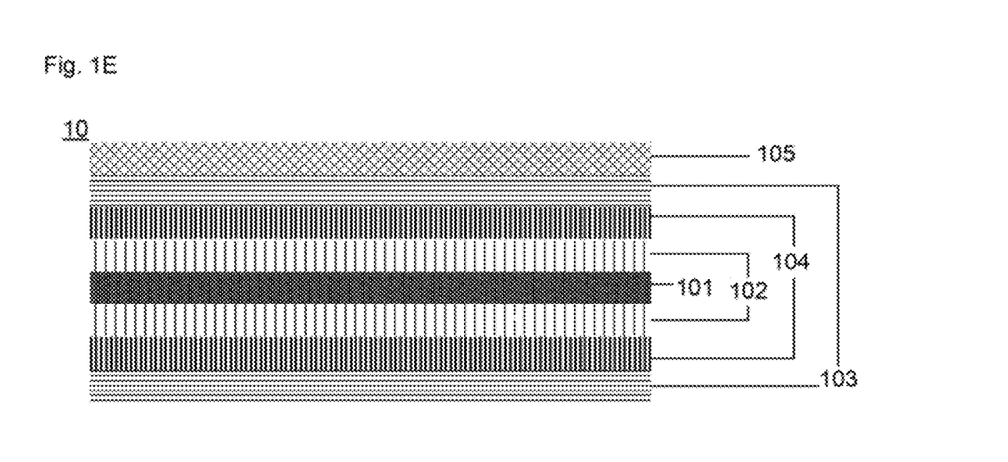
Figure 1F:
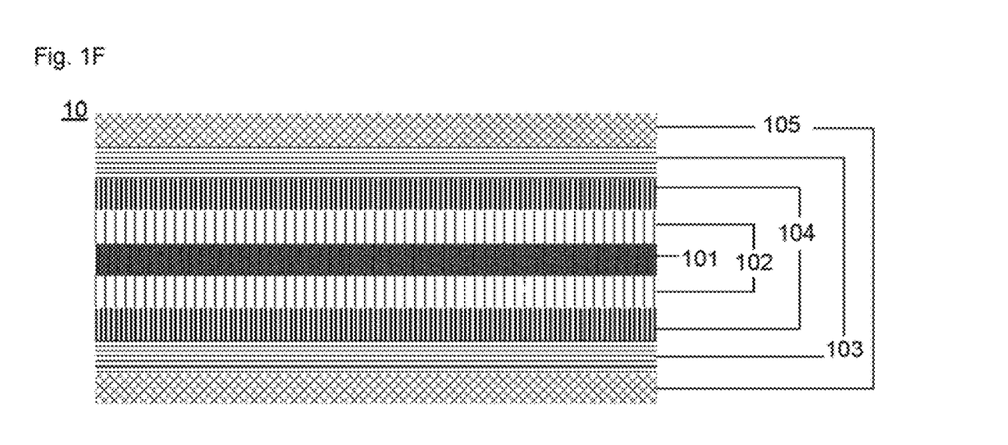

In one example of a composite comprising a core layer comprising PC and a first set and a second set of fiber-containing layers (as shown in FIG. 1B), wherein the core layer has a thickness of 0.2 mm, and each of the fiber-containing layers in the first set 102 and second set 103 has a thickness of 0.1 mm, the composite (having a total thickness of about 0.8 mm) has a flexural modulus of at least about 35 GPa—at least about 40 GPa, about 45 GPa, about 50 GPa, about 55 GPa, about 60 GPa, about 65 GPa, about 70 GPa, about 80 GPa or higher. It is noted that the fibers in these first and second sets are unidirectional fibers. Depending on the materials and geometry involved, higher or lower flexural modulus values are also possible.

The polymer-fiber composite described herein may have several additional desirable properties. Depending on the materials used, the polymer-fiber composite described herein may be recyclable, particularly for a composite comprising a thermoplastic core and carbon fibers. Moreover, in one example, because the flexural modulus of the polymer-fiber composites arises mainly from the unidirectional fibers, the composites described herein are less expensive than a composite otherwise comprising woven fibers. It is noted that unidirectional fibers generally are less expensive than woven fibers, particularly in the case of carbon fibers.

Additionally, while the polymer-fiber composite described herein may provide the same, or comparable, mechanical properties (e.g., flexural modulus) as a metal-containing composite, the polymer-fiber composite described herein may be lighter than the metal-containing composite. For example, the polymer-fiber composites described herein may have a density that is between about 1.2 g/cm$^3$ and about 1.7 g/cm$^3$—e.g., between about 1.3 g/cm$^3$ and about 1.6 g/cm$^3$, between about 1.4 g/cm$^3$ and about 1.5 g/cm$^3$, etc. Other values are also possible. In one example, the density is between about 1.3 g/cm$^3$ and about 1.4 g/cm$^3$.

Methods of Making

Figure 2:
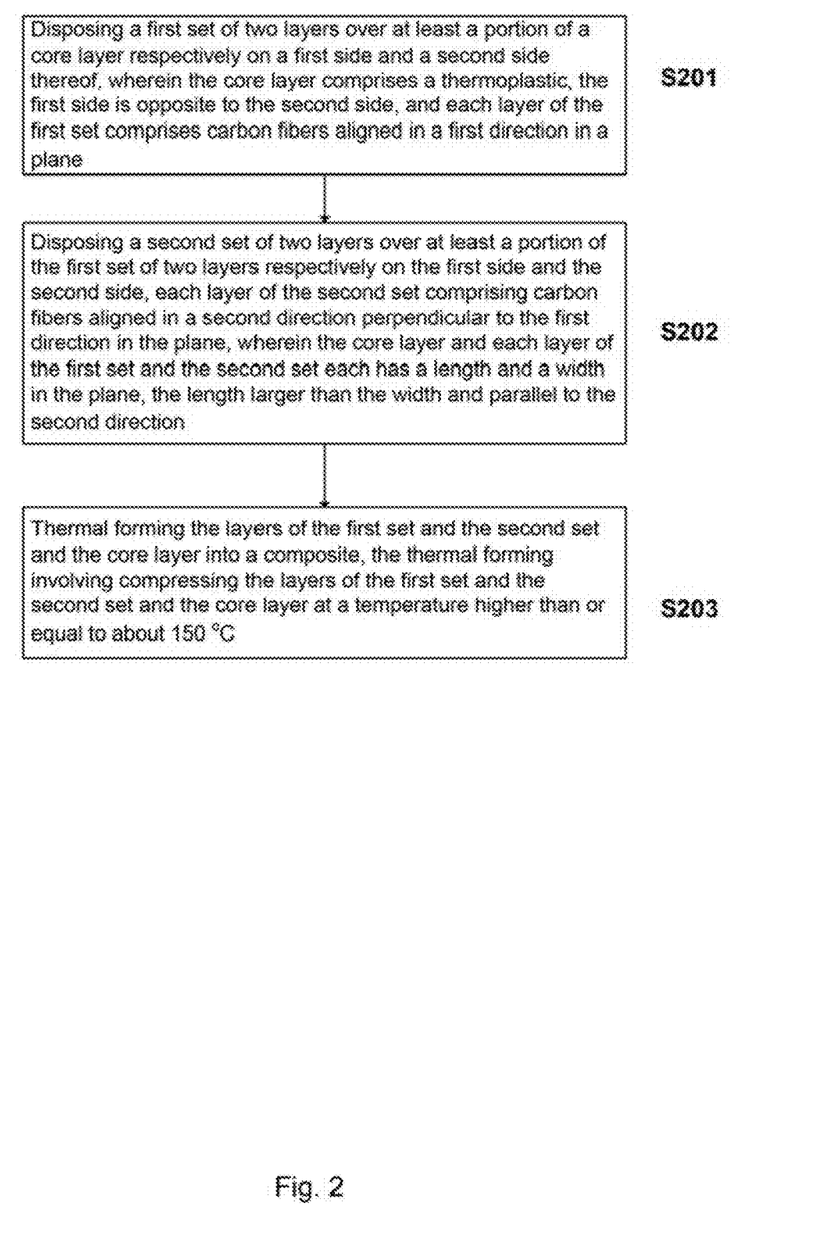
FIG. 2 provides a flowchart showing, in one example, the processes involved in making a polymer-fiber composite described herein.

The polymer-fiber composites described herein may be fabricated by a method involving any suitable process(es). FIG. 2 provides a flowchart showing the processes involved in one example of a method of making a composite described herein. As shown in FIG. 2, the method in this example comprises disposing a first set of two layers over at least a portion of a core layer respectively on a first side and a second side thereof (S201). As described above, the core layer may comprise a thermoplastic, the first side is opposite to the second side, and each layer of the first set may comprise carbon fibers aligned in a first direction in a plane. Subsequently, the method comprises disposing a second set of two layers over at least a portion of the first set of two layers respectively on the first side and the second side, each layer of the second set comprising carbon fibers aligned in a second direction perpendicular to the first direction in the plane (S202). The core layer and each layer of the first set and the second set each may have a length and a width in the plane, the length larger than the width and parallel to the second direction. Subsequently, the method comprises thermal forming the layers of the first set and the second set and the core layer into a composite (S203). The thermal forming may involve compressing the layers of the first set and the second set and the core layer at a temperature higher than or equal to about 150° C.

The conditions involved in the different processes during the fabrication described herein may vary depending on the materials involved. For example, thermal forming may involve a process in which a plastic sheet is heated to a pliable forming temperature, formed to a specific shape in a mold, and trimmed to create a usable product. The sheet may be heated in an oven to a temperature high enough to permit it to be stretched into or onto a mold and cooled to a finished shape. The sheet may be pressed at the elevated temperature by a mechanical pressure. The temperature to be elevated to may depend on the materials involved. For example, when the core layer comprises PC, the elevated (hot pressing) temperature may be at least about 140° C.—e.g., at least about 150° C., about 160° C. about 170° C., about 180° C., about 190° C., about 200° C., about 220° C., about 240° C., about 260° C., about 280° C., about 300° C., or higher. Other temperatures are also possible. In one example, the hot pressing temperature involved during thermal forming is between about 160° C. and about 260° C. In another example, the hot pressing temperature involved during thermal forming is between about 180° C. and about 220° C.

In one example, a plastic sheet is fed from a roll or from an extruder into a set of indexing chains that incorporate pins, or spikes, that pierce the sheet and transport it through an oven for heating to forming temperature. The heated sheet then indexes into a form station where a mating mold and pressure-box close on the sheet, with vacuum then applied to remove trapped air and to pull the material into or onto the mold along with pressurized air to form the plastic to the detailed shape of the mold. Plug-assists may be employed in addition to vacuum in the case of taller, deeper-draw formed parts in order to provide the needed material distribution and thicknesses in the finished parts. In one example, after a short form cycle, a burst of reverse air pressure is actuated from the vacuum side of the mold as the form tooling opens (also known as air-eject) to break the vacuum and assist the formed parts off of, or out of, the mold. A stripper plate may also be utilized on the mold as it opens for ejection of more detailed parts or those with negative-draft, undercut areas. In this example, the sheet containing the formed parts then indexes into a trim station on the same machine, where a die cuts the parts from the remaining sheet web, or indexes into a separate trim press where the formed parts are trimmed. The sheet web remaining after the formed parts are trimmed may be wound onto a take-up reel or fed into an inline granulator for recycling. Additional or different processes from those described herein during thermal forming may be employed.

Figure 3:
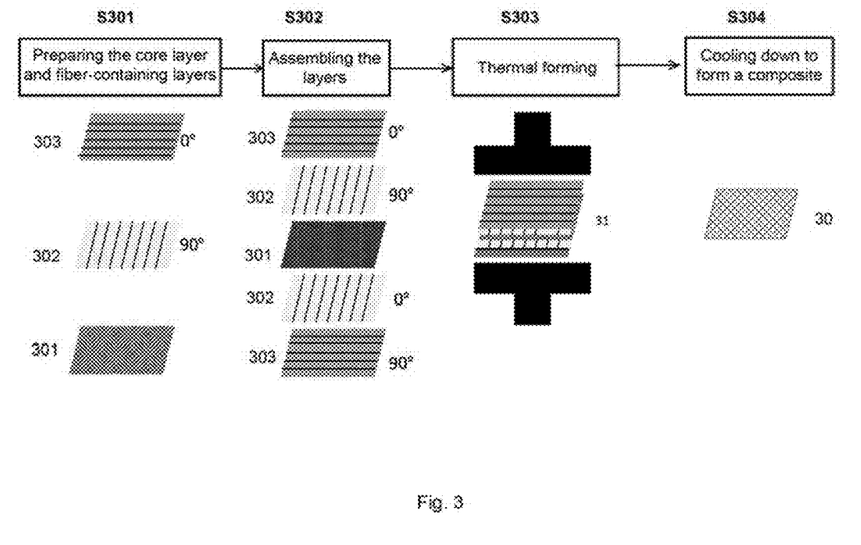
FIG. 3 provides a flowchart showing, in another example, the processes involved in making a polymer-fiber composite described herein.

FIG. 3 provides a flowchart illustrating the processes involved in another example or a method of fabricating a polymer-fiber composite described herein. As show in FIG. 3, the method includes preparing each of the core layer 301 and fiber-containing layers 302 and 303 (S301). The core layer 301, fiber containing layers 302 and 303 in FIG. 3 may be analogous to the core layer 101 and fiber-containing layers 102 and 103, respectively, as shown in FIGS. 1B-1F. The fibers in the layer 303 are aligned parallel to the direction (i.e., in the same direction) as the larger dimension of the article in a plane (hence the label 0°) and those in the layer 302 are aligned perpendicular to that direction in the plane (hence the label 90°). The preparation of the fiber-containing layers may involve cutting the commercially available fiber-containing layers and the core layer into the desired dimensions. In this example, the method then comprises assembling the different layers (S302), as described in, for example, FIG. 1B. The assembled layers are then thermal-formed into a preform 31 (S303). As described above, the thermal forming may involve pressing these layers at an elevated temperature, such as any of those described herein. Subsequently, the method described in FIG. 3 comprises cooling down the preset 31 to form a polymer-fiber composite 30, as described herein. The polymer-fiber composite 30 may be analogous to the composite 10 as shown in FIGS. 1A-IF.

Additional process(es) may be employed in the fabrication method described herein. For example, the method may further comprise impregnating the fibers in a thermoplastic polymeric matrix in the layers before the method of making the composite as described in FIG. 2 and/or FIG. 3 begins—i.e., "pre-impregnating" the fibers in the matrix. The impregnation of the fibers into the polymeric matrix may involve any suitable techniques. For example, the technique may comprise a batch process, such as hot pressing, such as one using multilayer lamination. The technique may also involve a continuous process, such as one using a flatbed-laminator system (e.g., MEYER® Flatbed-Laminator-Systems, from Herbert Meyer GmbH, Germany). The fibers may be any of those described herein, including carbon fibers, and the thermoplastic polymeric matrix may comprise any of the polymers described herein. The method may further comprise the composites as fabricated into another structural component, such as the housing of a device. The device may be an electronic device.

Applications

Due at least in part to the numerous aforedescribed desirable properties, the polymer-fiber composite described herein may be employed in various applications. For example, the composite may be an integral part of a structural component. The component may be a part of the housing of an electronic device. A housing of a device may refer to any structural component that encloses the interior of the device. In one example, the composite described herein is a part of the housing of an electronic device. For example, the composite may be any part of the housing, including back cover, front cover, side cover, and the like, of the device.

An electronic device herein may refer to any device comprising at least one electrical circuit. Thus, in one example, the housing that comprises the composite described herein may be external to the electrical circuit. The electronic device may be a consumer electronic device. An electronic device may refer to portable/mobile electronic device. An electronic device here may refer to a computer, a memory storage, a display, a signal transmitting device, and the like. A computer may refer to a desktop, a laptop, a tablet, a phablet, a tablone, and the like. A storage unit may refer to the hardware of a hard drive, a server, a processor, and the like. A display may refer to a monitor, a liquid crystal display ("LCD"), a television, and the like. A signal transmitting device may refer to a device transmitting any type of signal, including light, sound, heat, and the like. In one example, the electronic device is a mobile phone.

Not to be bound by any particular theory, but the configuration of the composite described herein may provide the device in which the composite is employed with desirable mechanical properties. As noted above, unidirectional fibers may be stronger mechanically in the direction of the preferred alignment. Thus, in one example, the fact that the unidirectional fibers are laid at the outermost layer and that the preferred orientation is parallel to the larger dimension of the composite means that the composite will have a larger mechanical strength along this preferred orientation at the outermost layer. This anisotropy of the polymer-fiber composite described herein allows the composite to provide the mechanical property (e.g., flexural modulus) along the direction needed (e.g., the larger dimension) without having to rely on increasing the thickness of the layer, the latter being the general approach in the case where the layer includes a material not having the anisotropic mechanical properties. For example, in the case of a polymer-woven fiber composite (with everything but the fiber orientation held invariant to the presently described polymer-(unidirectional) fiber composite), to achieve the same flexural modulus, the former would need to have a larger thickness and/or larger fiber content. The larger content and thickness each may result in higher material cost. Further, the fibers in the woven fiber composite need to be woven first, further increasing the manufacturing cost.

Further, a composite comprising a thermoplastic core sandwiched between unidirectional fibers has a large yield strength, relative to a metal (e.g., aluminum) or metal alloy of comparable, or the same size. A material having a large yield strength may be considered as a material having a high elasticity. Thus, by using the polymer-fiber composite and unidirectional fibers as the fibers in this composite, one may achieve both high elasticity and high flexural modulus. Such mechanical properties may be desirable particularly for a housing structural component, which is frequently subject to mechanical deformation (e.g., contact with another (often hard) object).

NON-LIMITING WORKING EXAMPLES

Materials and Methods

Six samples were measured in this Example for their respective flexural modulus values in accordance with ASTM D790. Sets of two specimens (50 mm×25 mm specimens) for two polymer-fiber composites ("Composite-01" and "Composite-02") and one aluminum-alloy ("Al5052 H32") were employed. The material, layer thickness, the fiber orientation, and the layer arrangement of Composite-01 and Composite-02 are provided in Tables 1 and 2, respectively. Composite-02 specimens comprise woven fibers and are herein used as comparative samples. "UD CF" denotes "unidirectional carbon fibers"; "Woven CF" denotes "woven carbon fibers"; and "Fiber Orientation" denotes the direction of fiber alignment relative to the length (i.e., the 50 mm dimension) of the specimen—0° refers to the direction parallel to the 55 mm direction, whereas 90° refers to the direction perpendicular to the 55 mm direction in the plane as defined by the 55 mm and 25 mm dimensions (i.e., the 25 mm dimension). In each of the UD CF layers in Composite-01, the unidirectional carbon fiber content was 60 wt %, balanced by PC/ABS. In each of the woven fiber layers in Composite-02, the woven carbon fiber content was 50 wt %, balanced by PC.

TABLE 1

The information of the different layers in Composite-01

| Layer | Material | Fiber Orientation | Thickness (mm) |
|---|---|---|---|
| 1 | UD CF | 0° | 0.1 |
| 2 | UD CF | 90° | 0.1 |
| 3 | UD CF | 90° | 0.1 |
| 4 | PC (Core) | n/a | 0.2 |
| 5 | UD CF | 90° | 0.1 |
| 6 | UD CF | 90° | 0.1 |
| 7 | UD CF | 0° | 0.1 |
| Overall Composite | | | 0.8 |

TABLE 2

The information of the different layers in Composite-02

| Layer | Material | Fiber Orientation | Thickness (mm) |
|---|---|---|---|
| 1 | Woven CF | n/a | 0.27 |
| 2 | Woven CF | n/a | 0.26 |
| 3 | Woven CF | n/a | 0.27 |
| Overall Composite | | | 0.8 |

The flexural modulus of the 50 mm by 25 mm specimens were measured using a 3-point bending test using Instron 59086 in accordance with ASTM D790-99. The rod on the testing machine of the 3-point bending test had a diameter of 4 mm. The specimen had a thickness of about 0.8 mm. The span of the sample was 32 mm. The span ratio of the specimen herein was fixed at 32 with varying specimen thickness. Span herein refers to the product of the span ratio and thickness of the sample. Thus, for a specimen thickness of about 0.8 mm, with a span ratio of 32 the span of the specimen was about 25.6 mm. The crosshead speed on the Instron was set at 1.3 mm/min for 0.8 mm (thickness) specimens. The flexural tests were performed after the specimens were conditioned at 23° C. and 50% relative humidity ("RH") for 48 hr.

Each specimen was measured in this Example for its density in accordance with ASTM D792. Specifically, the density was calculated from specific gravity measured at 23° C. with the ASTM D792 based on the following:

$$\text{Sp gr } 23/23° \text{ C.} = a/(a+\omega-b),$$

where $a$ is the apparent weight of the specimen without a wire or sinker in air; $b$ is the apparent weight of the specimen (and of the sinker) completely immersed and of the wire partially immersed in distilled water; and $\omega$ is the apparent weight of the totally immersed sinker and of the partially immersed wire. Thus, the density of carbon fiber composite was calculated from:

$$D \text{ (g/cm3)} = \text{Sp gr } 23/23° \text{ C.} \times 0.9975.$$

The error of the density measurement was between about 0.5% and about 2.0%.

Figure 4:
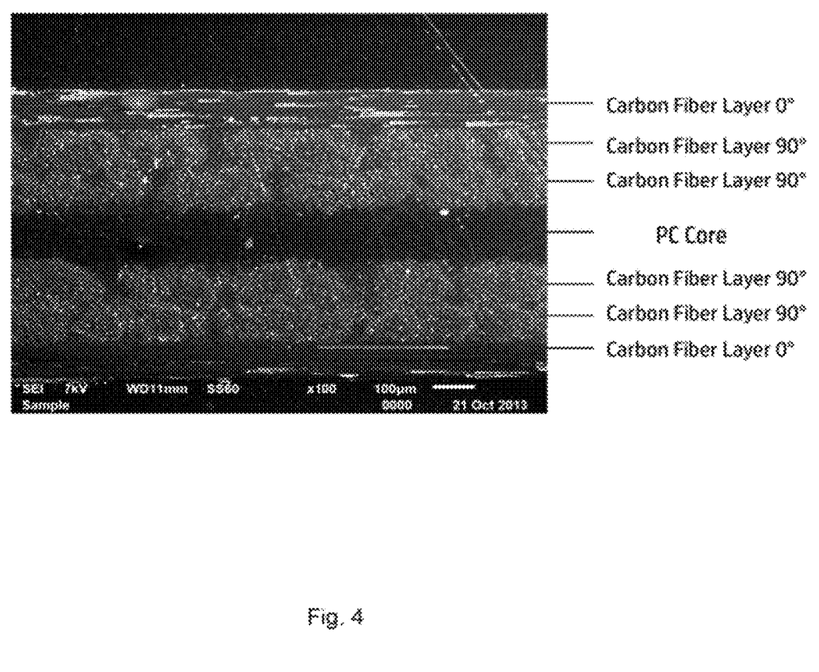
FIG. 4 shows a scanning electron microscope ("SEM") image of the cross-sectional view of one example of a polymer-fiber composite described herein.

The results of the flexural modulus and density measurements are shown in Table 3. FIG. 4 is an SEM image of one specimen of Composite-01, showing the different unidirectional carbon fiber layers, sandwiching the PC core layer in the middle. It is seen in FIG. 4 that on each side of the PC core, the outermost layer has fibers aligned parallel (0°) to the horizontal axis of the image (i.e., the 50 mm dimension of the specimen) and the two layers between this 0° fiber layer and the PC core have carbon fibers aligned perpendicular to the 0° fibers in the 25 mm direction in the plane (into/out of the page on the SEM image).

As shown in Table 3, Composite-01 and Composite-02 are much lighter than the aluminium Al 5052 H32 sample, as evidenced in the lower density thereof than that of the Al 5052 H32 sample. It was also observed that Composite-01 had a larger flexural modulus than Composite-02, evidencing the desirable flexural properties thereof compared to Composite-02. Also, the thickness of each layer containing fibers in Composite-02 is larger than that in Composite-01, and Composite-02 contains more carbon fibers than Composite-01 but does not have the same flexural modulus as Composite-01.

Moreover, while it was observed that Al 5052 H32 has a larger flexural modulus than both Composite-01 and Composite-02, it is readily known that an aluminum alloy has a lower yield strength than does a carbon-fiber composite. In other words, when subject to the same deformation, it is possible that Composite-01 and Composite-02 would undergo elastic deformation while the aluminium alloy would undergo permanent plastic deformation, despite the larger flexural modulus of the latter. It is generally considered desirable to prefer a larger elasticity to a larger flexural modulus when the material is frequently subject to mechanical deformation of various magnitudes, such as in the case of a computer cover, particularly a laptop cover. Thus, the aluminium alloy sample Al 5052 H32 is not considered desirable in this Example, where the parameters were evaluated in view of potential application in consumer electronic devices.

TABLE 3

Results of the flexural modulus and density measurements

| Sample Configuration | Fiber Orientation | Thickness (mm) | Crosshead speed (mm/min) | Specimen 1 | Specimen 2 | Mean Flexural Modulus (GPa) | Density (g/cm$^3$) |
|---|---|---|---|---|---|---|---|
| Composite-01 | 0° | 0.8 | 1.3 | 46.92 | 47.44 | 47.18 | 1.30 |
|  | 90° |  |  | 59.67 | 57.63 | 57.65 |  |
| Composite-02 | 0° | 0.8 | 1.3 | 36.24 | 37.53 | 36.88 | 1.55 |
|  | 90° |  |  | 36.24 | 35.78 | 36.01 |  |
| Al 5052 H32 | n/a | 0.8 | 1.3 | 76.47 | 79.12 | 77.80 | 2.69 | the contrary, should be understood to mean "at least one." Any ranges cited herein are inclusive.

The terms "substantially" and "about" used throughout this disclosure, including the claims, are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Concentrations, amounts, and other numerical data may be expressed or presented herein in a range format. Such a range format s used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "1 weight % (wt %) to 5 wt %" should be interpreted to include not only the explicitly recited values of 1 wt % to 5 wt %, but also include individual values and sub-ranges within the indicated range. Thus, included in this numerical range are individual values, such as 2, 3.5, and 4, and sub-ranges, such as from 1-3, from 2-4, and from 3-5, etc. This same principle applies to ranges reciting only one numerical value. Furthermore, such an interpretation should apply regardless of the breadth of the range or the characteristics being described.

The phrase "and/or," as used herein in this disclosure, including the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those

ADDITIONAL NOTES

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The indefinite articles "a" and "an," as used herein in this disclosure, including the claims, unless clearly indicated to elements specifically identified. Thus, as a non-limiting example, a reference to "A and/or B", when used in conjunction with open-ended language such as "comprising" can refer, in one example, to A only (optionally including elements other than B); in another example, to B only (optionally including elements other than A); in yet another example, to both A and B (optionally including other elements); etc.

As used in this disclosure, including the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in this disclosure, including the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one example, to at least one, optionally including more than one, A, with no B present (end optionally including elements other than B); in another example, to at least one, optionally including more than one, B, with no A present (and optionally including elements other than A); in yet another example, to at least one, optionally including more than one, A, and at least one, optionally including more than one, B (and optionally including other elements); etc.

In this disclosure, including the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, § 2111.03.

What is claimed:

1. A composite, comprising:
   a core layer comprising a thermoplastic polymer and having a first side and a second side opposite to the first side, wherein the core layer does not include reinforcing fibers;
   a first set of two layers disposed over at least a portion of the core layer respectively on the first side and the second side, each layer of the first set comprising carbon fibers aligned in a first direction in a plane;
   a second set of two layers disposed over at least a portion of the first set of two layers respectively on the first side and the second side, each layer of the second set comprising carbon fibers aligned in a second direction perpendicular to the first direction in the plane; and
   a third set of two layers disposed between the layers of the first set and the second set, respectively, on the first side and the second side, each layer of the third set comprising carbon fibers aligned in the first direction,
   wherein the composite in the plane has a length and a width, wherein the length is larger than the width and the length is parallel to the second direction, wherein the first direction is parallel to the width of the composite, wherein the composite has a thickness of less than or equal to 2.5 millimeters and has a flexural modulus of greater than or equal to 40 GPa.

2. The composite of claim 1, wherein the thermoplastic of the core comprises at least one of poly(methyl methacrylate) ("PMMA"), polycarbonate ("PC"), acrylonitrile butadiene styrene ("ABS"), poly (p-phenylene sulfide) ("PPS"), polyether ether ketone ("PEEK"), polyethersulfone ("PES"), or polyamide.

3. The composite of claim 1, wherein:
   the carbon fibers in the first set are embedded in a first polymeric matrix; and
   (ii) the carbon fibers in the second set are embedded in a second polymeric matrix,
   wherein the first polymeric matrix and the second polymeric matrix each independently comprises at least one of poly(methyl methacrylate) ("PMMA"), polycarbonate ("PC"), acrylonitrile butadiene styrene ("ABS"), poly (p-phenylene sulfide) ("PPS"), polyether ether ketone ("PEEK"), polyethersulfone ("PES"), or polyamide.

4. The composite of claim 1, wherein the carbon fibers in at least one of the first set or the second set comprise continuous fibers.

5. The composite of claim 1, wherein the carbon fibers in at least one of the first set or the second set comprise at least one of polyacrylonitrile ("PAN"), rayon, pitch, or aramid-carbon fibers.

6. The composite of claim 1, wherein each layer of the first set has a larger thickness than each layer of the second set.

7. The composite of claim 1, further comprising at least one surface layer disposed over at least one layer of the second set, the surface layer comprising woven carbon fibers.

8. The composite of claim 1, wherein the composite is a part of a housing of an electronic device.

9. The composite of claim 1, wherein the composite is formed into a housing that is external to an electrical circuit.

10. The composite of claim 9, further comprising at least one surface layer disposed over at least one layer of the second set, the surface layer comprising woven carbon fibers.

11. The composite of claim 1, wherein the carbon fibers in the first set are embedded in a first polymeric matrix.

12. The composite of claim 1, wherein the carbon fibers in the second set are embedded in a second polymeric matrix.

13. The composite of claim 1, wherein the first polymeric matrix comprises at least one of poly(methyl methacrylate) ("PMMA"), polycarbonate ("PC"), acrylonitrile butadiene styrene ("ABS"), poly (p-phenylene sulfide) ("PPS"), polyether ether ketone ("PEEK"), polyethersulfone ("PES"), or polyamide.

14. The composite of claim 1, wherein the second polymeric matrix comprises at least one of poly(methyl methacrylate) ("PMMA"), polycarbonate ("PC"), acrylonitrile butadiene styrene ("ABS"), poly (p-phenylene sulfide) ("PPS"), polyether ether ketone ("PEEK"), polyethersulfone ("PES"), or polyamide.

* * * * *

UNITED STATES PATENT AND TRADEMARK OFFICE
CERTIFICATE OF CORRECTION

PATENT NO. : 10,462,920 B2  
APPLICATION NO. : 15/518521  
DATED : October 29, 2019  
INVENTOR(S) : Cheng-Feng Liao et al.

Page 1 of 1

It is certified that error appears in the above-identified patent and that said Letters Patent is hereby corrected as shown below:

On the Title Page

In Column 2, item (57), Abstract, Line 11, delete "plane" and insert -- plane. --, therefor.

In the Claims

In Column 14, Line 12 (approx.), Claim 3, before "the" insert -- (i) --.

Signed and Sealed this  
Thirty-first Day of December, 2019

Andrei Iancu  
*Director of the United States Patent and Trademark Office*